(12) United States Patent
Nakanishi

(10) Patent No.: US 6,233,444 B1
(45) Date of Patent: May 15, 2001

(54) RADIO RECEIVING METHOD AND RADIO RECEIVING APPARATUS

(75) Inventor: Hideo Nakanishi, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/044,181

(22) Filed: Mar. 19, 1998

(30) Foreign Application Priority Data

Mar. 20, 1997 (JP) .................................................. 9-085634

(51) Int. Cl.[7] ........................................................ H04B 1/26
(52) U.S. Cl. ............................. 455/313; 455/314; 455/323
(58) Field of Search ................................ 455/313, 314, 455/317, 318, 323, 324, 186.1, 193.1, 196.1, 193.3, 86, 76, 131

(56) References Cited

U.S. PATENT DOCUMENTS

| | | | |
|---|---|---|---|
| 3,825,838 | * 7/1974 | Mayle | 455/193.1 |
| 4,817,195 | * 3/1989 | Kubo et al. | 455/196.1 |
| 5,301,358 | * 4/1994 | Gaskill et al. | 455/193.3 |
| 5,465,403 | * 11/1995 | Owaki et al. | 455/186.1 |
| 5,471,662 | * 11/1995 | Shiota | 455/186.1 |
| 5,530,929 | * 6/1996 | Lindqvist et al. | 455/324 |
| 5,761,615 | * 6/1998 | Jaffee | 455/324 |
| 5,905,948 | * 5/1999 | Suzuki | 455/193.1 |
| 5,937,335 | * 8/1999 | Park et al. | 455/86 |
| 5,949,830 | * 9/1999 | Nakanishi | 455/314 |
| 5,953,643 | * 8/1999 | Speake et al. | 455/324 |

FOREIGN PATENT DOCUMENTS

| | | |
|---|---|---|
| 7-321686 | 12/1995 | (JP) . |
| 8-18477 | 1/1996 | (JP) . |

OTHER PUBLICATIONS

Copy of an English Language Abstract of JP No. 7–321686.
Copy of an English Language Abstract of JP No. 8–18477.

* cited by examiner

Primary Examiner—Nay Maung
Assistant Examiner—Quochien B. Vuong
(74) Attorney, Agent, or Firm—Greenblum & Bernstein, P.L.C.

(57) ABSTRACT

A radio receiving apparatus has a receiving section for receiving a radio signal, a local oscillating section for generating a first local oscillation signal and a second local oscillation signal, wherein the first local oscillation signal and the second local oscillation signal have each of a first frequency and a second frequency differing from a received frequency. The apparatus also has a frequency converting section for mixing the received signal output from the receiving section and the first local oscillation signal to output an intermediate frequency signal and an orthogonal converting section for orthogonal converting the intermediate frequency signal output with the second local oscillation signal.

19 Claims, 7 Drawing Sheets

RADIO RECEIVING METHOD AND RADIO RECEIVING APPARATUS

BACKGROUND OF THE INVENTION

1. Field of the Invention

The present invention relates to a radio receiving method and a radio receiving apparatus which are used to obtain baseband signals by orthogonally converting radio receipt signals after being frequency-converted, when receiving and demodulating a simultaneous paging signal such as a pager, etc.

2. Description of the Related Art

Conventionally, a pager has been known as one of radio receiving apparatus which receive a simultaneous paging signal, telephone number and business of a transmission pager (caller) and display the same. A super heterodyne system has been employed for conventional pagers. In the super heterodyne type pagers, a narrow-band filter, for example, a band-pass filter (BPF) is disposed between an antenna and a receiving amplifier. However, since the BPF is large-sized, there is such a problem where if a BPF is equipped in a pager, the pager itself is unavoidably made large in size. Therefore, in recent pagers, a direct conversion (DC) receiving system which has a simple construction and is able to be small-sized is employed.

FIG. 8 is a block diagram showing major parts of a DC receiving type radio receiving apparatus. FIG. 8 shows a frequency signal processing system to orthogonal conversion in a radio receiving apparatus in which a DC receiving system is employed. In the radio receiving apparatus, radio waves of FSK system coming from the base station are received by antenna Ant1, and the receiving signal (f0) is amplified by a high-frequency amplifier 2. Amplification signal (f0) coming from high-frequency amplifier 2 is inputted into mixers 3a, 3b. Local oscillation signals (cosine wave signals, sine wave signals) which are of the same frequency (fL) as that of the receiving signals (f0) are inputted into these mixers 3a, 3b, wherein the receiving signals (f0) are multiplied by the local oscillation signals.

A local oscillation signal (fL) of cosine wave signals outputted from local oscillator 7 is supplied into the mixer 3a, and sine wave signals, in which the phase of the local oscillation signals (fL) outputted from the local oscillator 7 is shifted 90° by phase shifter 8, is supplied into the mixer 3b. Orthogonal conversion is carried out by multiplying the receiving signal (f0) by local oscillation signals (cosine wave signals, sine wave signals) in the mixers 3a, 3b, whereby base band signals (I component signals and Q component signals) are obtained.

I signals and Q signals outputted from mixers 3a, 3b are inputted into a demodulation circuit 6 after they are band-limited through channel filters 4a, 4b having the center frequency corresponding to the receiving channel (ch) and limiters 5a, 5b. Then, demodulation signals are outputted from the demodulation circuit.

Furthermore, at the local oscillator 7, oscillation circuit 9 is caused to oscillate at the reference frequency of crystal oscillator XTAL, wherein oscillation signals of oscillation circuit 9 are given to phase locked loop (PLL) portion 10 consisting of a phase comparator, prescaler, programmable divider (counter), mixer, etc. (which are not illustrated). The oscillation frequency of voltage control oscillator (VCO) 12 is locked to a specified frequency by a control voltage which is generated by causing the output signals of PLL portion 10 to pass through a low pass filter (LPF) 11. The oscillation signal (fV), the frequency of which is locked, is multiplied by multiplication circuit 13, and local oscillation signals having the same frequency (fL) as that of the receiving frequency (f0) are sent out to mixers 3a, 3b. In the PLL portion 10, programmable divider, etc. receives control signals from CPU 14 to cause the receiving frequency to be established.

The entirety of local oscillator 7 is covered by shield case 15, whereby unnecessary radiation is attempted to be decreased. However, especially, since the resonance frequency of antenna Ant1 is identical to that of local oscillation signals, the local oscillation signals are radiated through antenna Ant1. This becomes unnecessary radiation waves and is received again. If a phase difference exists between the unnecessary radiation waves and the receiving frequency (f0), noise is generated in the demodulation signals. Furthermore, unnecessary radiation of intensive electric field strength is mixed from a circuit substrate member, at which local oscillator 7 cannot be shielded by a shield case 15, etc., into a mixer.

Improvement of unnecessary radiation from an antenna in such a DC receiving system was proposed. For example, as disclosed in Japanese Laid-open Patent Publication No. 321686 of 1995, local oscillation signals inputted into a mixer where orthogonal conversion is carried out are set in a phase relationship where they are drowned each other. Thereby, unnecessary radiation power from antenna can be decreased.

However, in the example of the abovementioned Patent Publication, although improvement of decreasing unnecessary radiation power from antenna was attempted, it is difficult to carry out an accurate orthogonal conversion by the mixer, and simultaneously the apparatus will be made large-sized, wherein the actual mounting area of electronic components is decreased, and the process work will be made cumbersome.

That is, since local oscillation signals coming from the local oscillation portion are, directly or through a common earth, jumped into a mixer or antenna system, it is necessary to cover the local oscillation portion with a shield case as in the description of the former in the conventional example. Furthermore, since local oscillation signals are jumped directly into the antenna system, it is difficult to securely prevent local oscillation signals from being radiated from an antenna, the frequency of which is the same as that of the local oscillation signals. Therefore, unnecessary radiation waves are received again, wherein as a phase difference occurs between the unnecessary radiation waves and the receiving frequency, noise is caused to occur in the demodulation signals.

Furthermore, If the local oscillation portion is covered by a metal-made shield case, space is caused to occur between members inside the shield case and internal electronic components. In other words, the shield case is made large-sized. Resultantly, this becomes an obstacle in view of requirements of downsizing and light weight.

Still furthermore, since a large-sized shield case is disposed, the actual mounting area of secondary and thirdly circuit substrates of electronic components is decreased. In this case, since more electronic components can not be mounted, no high performance and downsizing can be achieved. Furthermore, since it is difficult to automatically dispose a large-sized shield case in the standard automatic surface mounting machine, manual work is requisite. That is, a shield case attaching process and soldering process are made cumbersome, wherein the assembling efficiency is worsened.

SUMMARY OF THE INVENTION

The present invention was developed in view of the abovementioned situations, and it is therefore an object of the invention to provide an excellent radio receiving method and a radio receiving apparatus, which are able to eliminate a comparatively large-sized shield case, to carry out an accurate orthogonal conversion, and enable a downsizing and light weight, and which improve the efficiency of assembling processes.

In order to achieve the abovementioned object, the present invention is constructed so that receiving signals are frequency-converted by local oscillation signals of the second frequency generated by a local oscillation portion after they are frequency-converted by local oscillation signals of the first frequency generated from the output of the abovementioned local oscillation portion, and they are orthogonally converted to obtain a base band signals.

Furthermore, the invention is constructed so that after the receiving signals are converted to intermediate frequency signals by mixing them with local oscillation signals of the first frequency, the intermediate frequency signals are directly mixed with local oscillation signals of the second frequency, wherein by orthogonal conversion, base band signals are obtained.

Furthermore, a radio receiving apparatus according to the invention comprises a receiving circuit for receiving radio waves; a frequency converting circuit for outputting intermediate frequency signals frequency-converted by mixing receiving signals from the receiving circuit and local oscillation signals of the first frequency; an orthogonal conversion circuit for outputting base band signals orthogonally converted by mixing the intermediate frequency signals from the frequency conversion circuit with local oscillation signals of the second frequency; and a basic frequency oscillation circuit for oscillating a basic frequency signal in order to generate local oscillation signals of the abovementioned first frequency and second frequency.

In these aspects of the invention, since radio receiving signals are frequency-converted by local oscillation signals of the second frequency generated from the output of the local oscillation portion after they are frequency-converted by the local oscillation signals of the first frequency generated from the output of the abovementioned local oscillation portions and base band signals are obtained by orthogonal conversion, the resonance frequency of antenna is not the same as the frequency of the first local oscillation signals as in a conventional DC receiving system, unnecessary radiation of local oscillation signals having the same frequency as the resonance frequency of the antenna is eliminated. In other words, it is possible to suppress noise generation due to receiving unnecessary radiation waves again.

Furthermore, since no mixing due to jumping of local oscillation signals of intensive field strength in frequency conversion and orthogonal conversion, accurate orthogonal conversion can be carried out. Furthermore, a comparatively large-sized shield case, covering the local oscillation portion, which is not able to be automatically mounted, is not required any more, it is possible to make the apparatus small-sized and and the assembling efficiency can be improved.

By making the sum of the first frequency and second frequency equal to the frequency of the receiving signals, an adequate frequency conversion can be achieved by a direct conversion system.

In this case, in order to carry out receiving by the direct conversion system, the basic frequency signal of the local oscillation signals may be set to a frequency obtained by dividing the receiving frequency by the sum of a multiplication ratio for generating the local oscillation signal of the first frequency and a multiplication ratio for generating the local oscillation signal of the second frequency.

Furthermore, the invention is constructed so that the same is able to selectively receive receiving signals of a plurality of frequencies and to change at least one of the first and second frequencies corresponding to the receiving frequency.

Furthermore, the invention is constructed so that the same comprises an antenna varying circuit capable of selectively receiving signals of a plurality of frequencies and a variable multiplication circuit for generating local oscillation signals of the first frequency and local oscillation signals of the second frequency from the basic frequency signals corresponding to the receiving frequency.

Thereby, it is possible for a single receiver to receive electric waves of different frequencies, and the receiver is preferable in a case where the same type of apparatuses are exported to a plurality of countries.

DETAILED DESCRIPTION OF THE PREFERRED EMBODIMENTS

A description is given of embodiments of a radio receiving method and a radio receiving apparatus according to the invention, with reference to accompanying drawings.

FIRST EMBODIMENT

Figure 1:
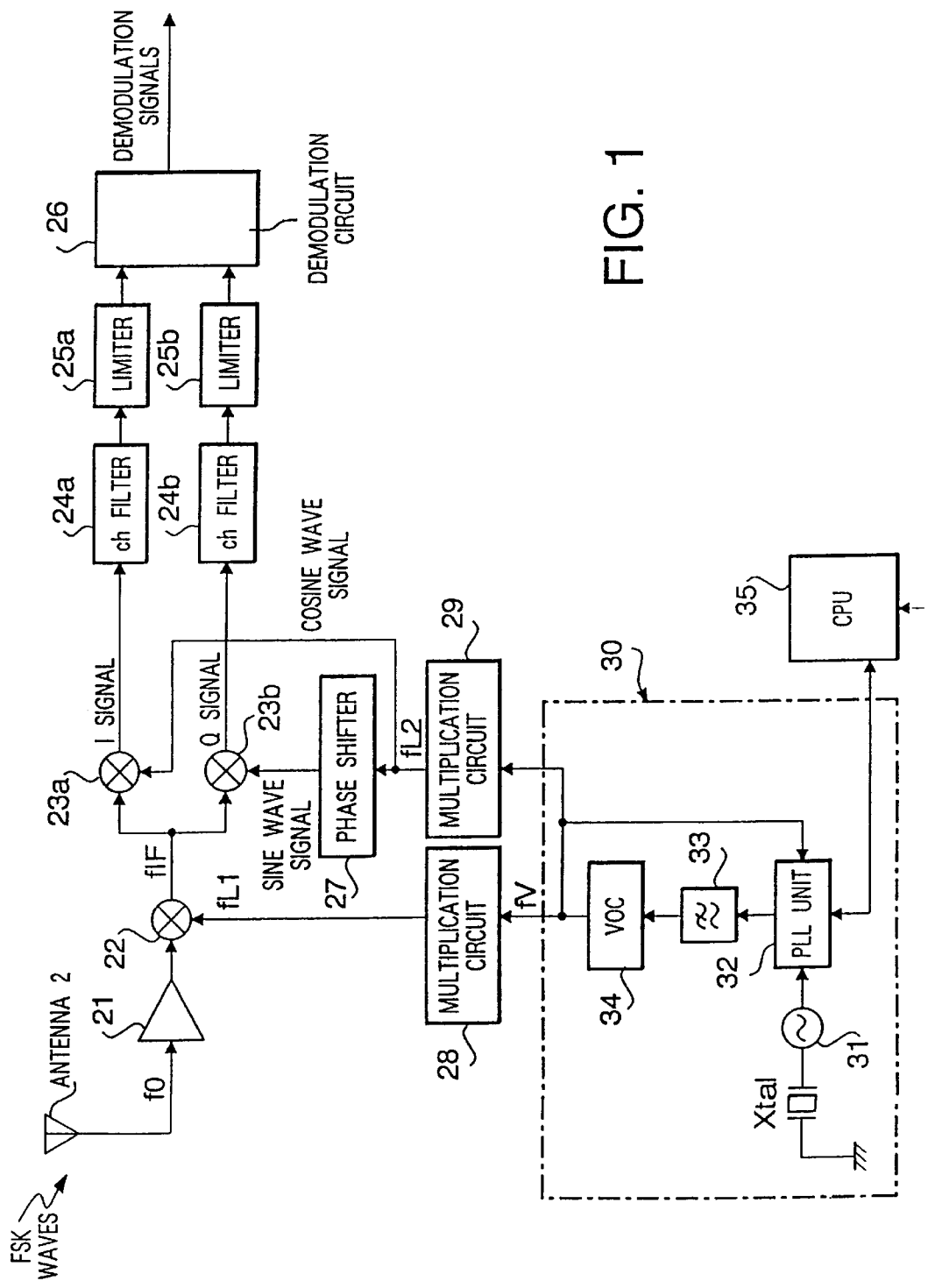
FIG. 1 is a block diagram showing a configuration of a first embodiment of the invention.

FIG. 1 is a block diagram showing a configuration of the first preferred embodiments of a radio receiving apparatus according to the invention. In FIG. 1, a high-frequency processing system to orthogonal conversion in a radio receiving apparatus is shown. The radio receiving apparatus has antenna Ant2 for receiving FSK type paging signals, and a high-frequency amplifier 21 for amplifying the receiving signals (f0) from the antenna Ant2. Furthermore, the apparatus is provided with a mixer 22 where amplification signals (f0) are inputted from the high-frequency amplifier 21, are mixed with the first local oscillation signals (fL1) and are converted to intermediate frequency signals of frequency (fIF).

Furthermore, this embodiment is provided with mixers 23a, 23b which output base band signals (I signals, Q signals) obtained by orthogonal conversion which is carried out after intermediate frequency signals of frequency (fIF) outputted by mixer 22 are multiplied by the second local oscillation signals (fL2: cosine wave signal, sine wave signals), and the same is further provided with channel filters 24a, 24b for limiting the bands of I signals and Q signals from mixers 23a, 23b, limiters 25a, 25b for controlling the level of I signals and Q signals from the channel filters 24a, 24b to a fixed level, and a demodulation circuit 26 which outputs demodulation signals by which I signals and Q signals outputted by the limiters 25a, 25b are demodulated.

Furthermore, the embodiment is provided with local oscillation unit 30 which outputs local oscillation signals (fV) for frequency conversion and orthogonal conversion and is further provided with a multiplication circuit 28 which outputs the first local oscillation signals (fL1) obtained by multiplying "x" times the local oscillation signals (fV) outputted by the local oscillation unit 30 to the mixer 22, and a multiplication circuit 29 which outputs the second local oscillation signals (fL2) obtained by multiplying "y" times the local oscillation signals (fV) outputted by the local oscillation unit 30 to the mixer 23a and phase shifter 27.

The local oscillation unit 30 include oscillation circuit 31 which oscillates at the reference frequency of a crystal oscillator XTAL and a phased lock loop (PLL) portion 32 which is composed of a phase comparator, prescaler, programmable divider (counter) and mixer (which are not illustrated). The oscillation unit 30 is provided with a low pass filter (LPF) 33 which converts control signals coming from PLL portion 32 into direct current and outputs the same, a voltage control oscillator (VCO) 34 which outputs oscillation signals (fV) frequency-locked by a direct-current control voltage coming from the PLL 33 to multiplication circuits 28, 29. These components constitute a closed loop circuit.

Furthermore, the embodiment is also provided with CPU 35 which changes a programmable divider (not illustrated) by control signals in the PLL 32 and establishes the receiving frequency.

Next, a description is given of actions of the first preferred embodiment.

Receiving signals (f0) coming from antenna Ant2 are amplified by a high-frequency amplifier 21. The amplification signal (f0) is inputted into the mixer 22. In this mixer 22, wherein the amplification signals (f0) are frequency-changed to intermediate frequency signals of frequency (fIF) by the first local oscillation signals (fL1), and the intermediate frequency signals are outputted into mixers 23a, 23b.

In the mixers 23a, 23b of the latter stage, the intermediate frequency signals outputted by mixer 22 and the second local oscillation signals (fL2: cosine wave signal, sine wave signal) are multiplied by each other and orthogonally converted, wherein base band signals (I signals and Q signals) obtained by the orthogonal conversion are outputted. I signals and Q signals coming from mixers 23a, 23b are band-limited through channel filters 24a, 24b, and are further inputted into limiters 25a, 25b, wherein after the level of I signals and Q signals is suppressed to be fixed, they are demodulated by demodulation circuit 26, and the demodulation signal is outputted.

In the local oscillation unit 30, oscillation circuit 31 is caused to oscillate at the reference frequency of crystal oscillator XTAL. Oscillation signals of the oscillation circuit 31 are inputted into PPL 32. Phase comparison differential signals between oscillation output signals (fV) of VCO 34 and multiplication oscillation signals from the oscillation circuit 31 are converted to direct current by LPF 33, wherein VCO 34 outputs frequency-locked oscillation signals (fV) to multiplication circuits 28, 29 by the direct current control voltage. The first and second local oscillation signals (fL1, fL2) multiplied by the multiplication circuits 28, 29 are inputted into mixer 23b through mixers 22, 23a and phase shifter 27.

The frequency relationship of frequency conversion in the mixer 22 and orthogonal conversion in mixers 23a, 23b is expressed by the following equation (1):

$$f0=fL1+fL2 \quad (1)$$

where $f0 \neq fL1$, $f0 \neq fL2$, $fL1=fV \cdot x$, $fL2=fV \cdot y$, $fIF=fL2$ In such receiving processing, a programmable divider, etc. in the PLL 32 is changed and controlled by a control signal coming from CPU 35 and is set to the receiving frequency.

Thus, since the frequency conversion by mixer 22 and orthogonal conversion by mixers 23a, 23b are based on the relationship expressed by equation (1), no comparatively large-sized shield case which covers the local oscillation unit 30 is required any more.

That is, in comparison with a case of DC receiving system conventionally used, the resonance frequency of antenna Ant2 is different from the frequency of the first local oscillation signals (fL1), wherein no unnecessary radiation is produced from antenna Ant2. Therefore, it is possible to prevent noise from occurring due to receiving unnecessary radiation waves again. Furthermore, even though unnecessary radiation of intensive field strength from the local oscillation unit 30 is mixed into the mixer 22 since the local oscillation signals (fV) which the local oscillation unit 30 outputs to mixer 22 are different from the receiving signals (f0), the influence can be eliminated. Furthermore, the second local oscillation signals (fL2) is attenuated and supplied into the mixers 23a, 23b through multiplication circuit 29 and phase shifter 27, the influence thereof is also eliminated. In other words, an accurate orthogonal conversion can be carried out.

Furthermore, since no shield case is used, no space to cover electronic components of the local oscillation unit 30 is generated. Therefore, the entire of the apparatus can be small-sized, and particularly downsizing and light weight, which are requisite for pagers, are further improved. That is, since no shield case which is difficult to be automatically mounted by an automatic surface mounting apparatus is required, the attaching process and soldering process can be simplified, and the efficiency thereof can be further improved.

SECOND EMBODIMENT

Figure 2:
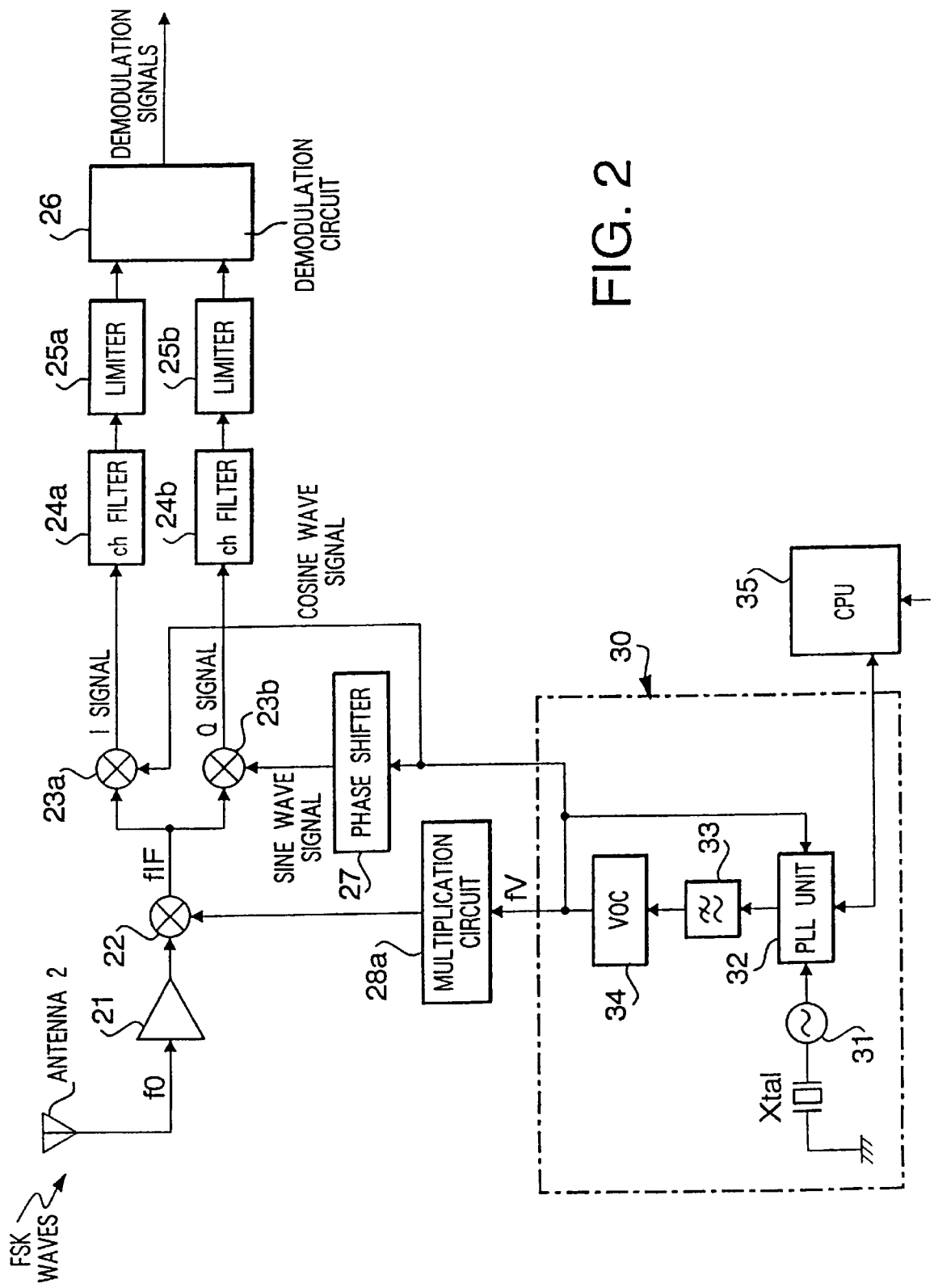
FIG. 2 is a block diagram showing a configuration of a second embodiment of the invention.

FIG. 2 is a block diagram showing a configuration of the second preferred embodiment. The basic construction of the second preferred embodiment is identical to that of the first embodiment shown in FIG. 1, wherein the second embodiment differs in that a multiplication circuit 29 is removed from a pass of supplying oscillation signals from the local oscillation unit 30 to mixer 23a and phase shifter 27.

The second preferred embodiment is provided with only a multiplication circuit 28a which multiplies "x" times the oscillation signals (fV) coming from the local oscillation unit 30 to sends the same to the mixer 22. Oscillation signals (fV) coming from the local oscillation unit 30 is directly supplied to the mixer 23b through the mixer 23a and phase shifter 27. All the other construction is identical to that of the first preferred embodiment.

Actions of the second preferred embodiment are the same as those of the first embodiment. However, the frequency relationship of frequency conversion in the mixer 22 and orthogonal conversion in the mixers 23a, 23b is expressed by the following equation (2):

$$f0 = fL1 + fL2 \quad (2)$$

where $f0 \ne fL1$, $f0 \ne fL2$, $fL1 = fV \cdot x$, $fIF = fL2 = fV$

In the second preferred embodiment, since a single multiplication circuit 28a is enough, the construction thereof can be simplified, and the other advantages are the same as those of the first preferred embodiment.

THIRD EMBODIMENT

Figure 3:
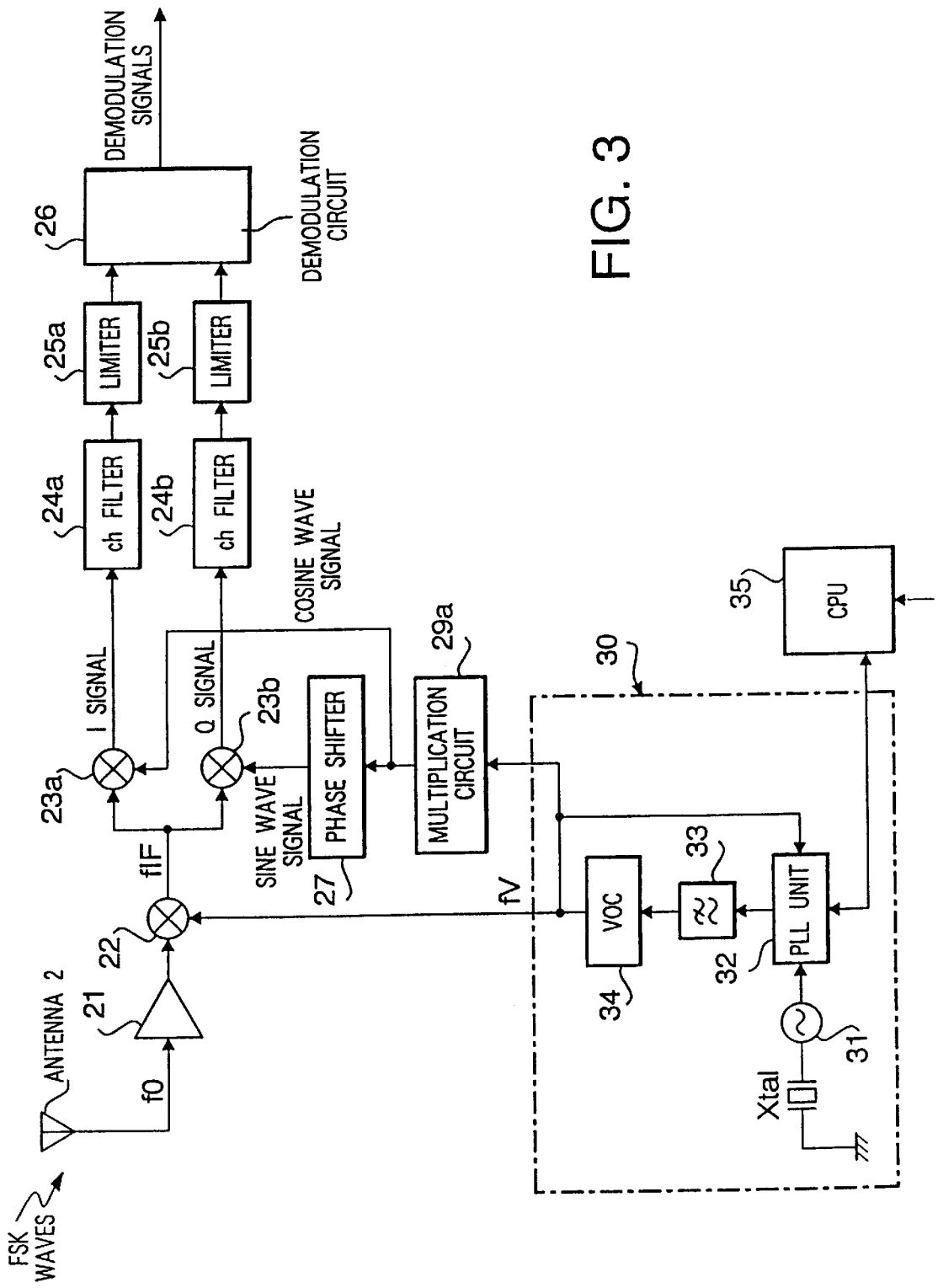
FIG. 3 is a block diagram showing a configuration of a third embodiment of the invention.

FIG. 3 is a block diagram showing a configuration of the third preferred embodiment.

The basic construction of the third embodiment is the same as that of the first embodiment shown in FIG. 1. However, the third embodiment differs in that a multiplication circuit 28 is removed from a pass of supplying oscillations from the local oscillation unit 30 to the mixer 22.

The third preferred embodiment is provided with only a multiplication circuit 29a which supplies oscillation signals (fV) coming from the local oscillation unit 30 to the mixer 23a after multiplying the same "y" times, shifts the phase of oscillation signals (fV) from the local oscillation unit 30 ninety degrees (90°) by a phase shifter 27 and supplies the same to the mixer 23b. The oscillation signals (fV) coming from the local oscillation unit 30 are directly supplied to the mixer 22. All the other construction is identical to that of the first preferred embodiment.

Actions of the third preferred embodiment are the same as those of the first embodiment. However, the frequency relationship of frequency conversion in the mixer 22 and orthogonal conversion in the mixers 23a, 23b is expressed by the following equation (3):

$$f0 = fL1 + fL2 \quad (3)$$

where $f0 \ne fL1$, $f0 \ne fL2$, $fL1 = fv$, $fL2 = fV \cdot y$, $fIF = fL2$.

In the third preferred embodiment, a single multiplication circuit 29a is enough, the construction is able to be simplified, and all the other advantages are the same as those of the first embodiment.

FOURTH EMBODIMENT

Figure 4:
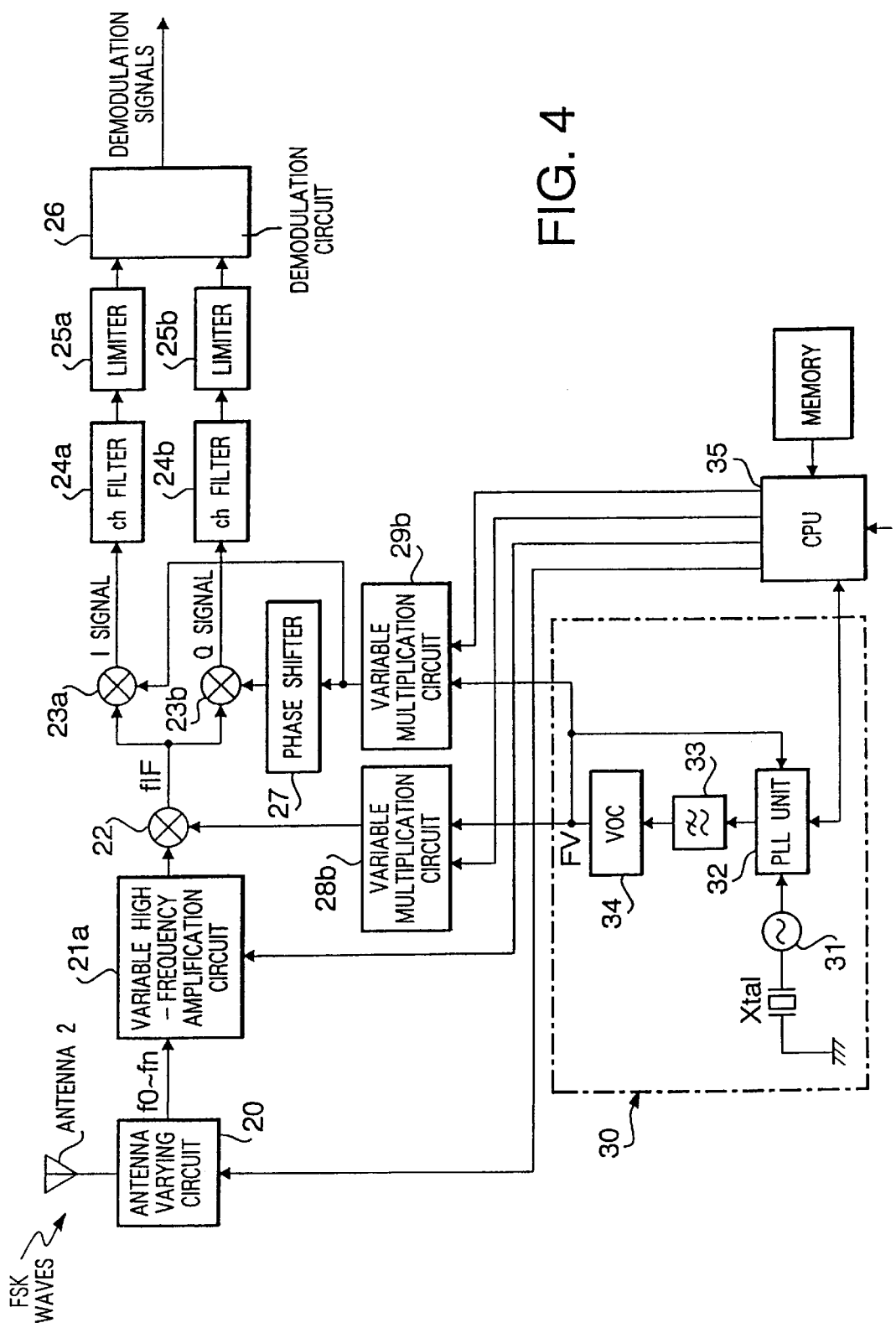
FIG. 4 is a block diagram showing a configuration of a fourth embodiment of the invention.

FIG. 4 is a block diagram showing a configuration of the fourth preferred embodiment.

The fourth preferred embodiment has a feature of greatly varying the receiving frequencies (f0 to fn), which can meet a requirement where the service frequency bands are different according to districts.

The basic configuration is similar to that of the first preferred embodiment shown in FIG. 1. However, the fourth preferred embodiment is provided with an antenna varying circuit 20 for changing the tuning frequency of antenna Ant 2 by control signals to change the frequency received from CPU 35 and a variable high-frequency amplification circuit 21a for carrying out the high-frequency amplification by changing the tuning frequency by frequency changing control signals coming from CPU 35 to receiving signals (f0 to fn) coming from the antenna circuit 20.

Furthermore, variable multiplication circuits 28b, 29b which vary multiplication frequencies corresponding to the frequency changing control signals from CPU 35 are employed therein. Still furthermore, a memory 36 which stores programs and tables for varying the receiving frequencies (f0 to fn) is provided in CPU 35. All the other construction thereof is the same as that of the first preferred embodiment shown in FIG. 1.

Figure 5:
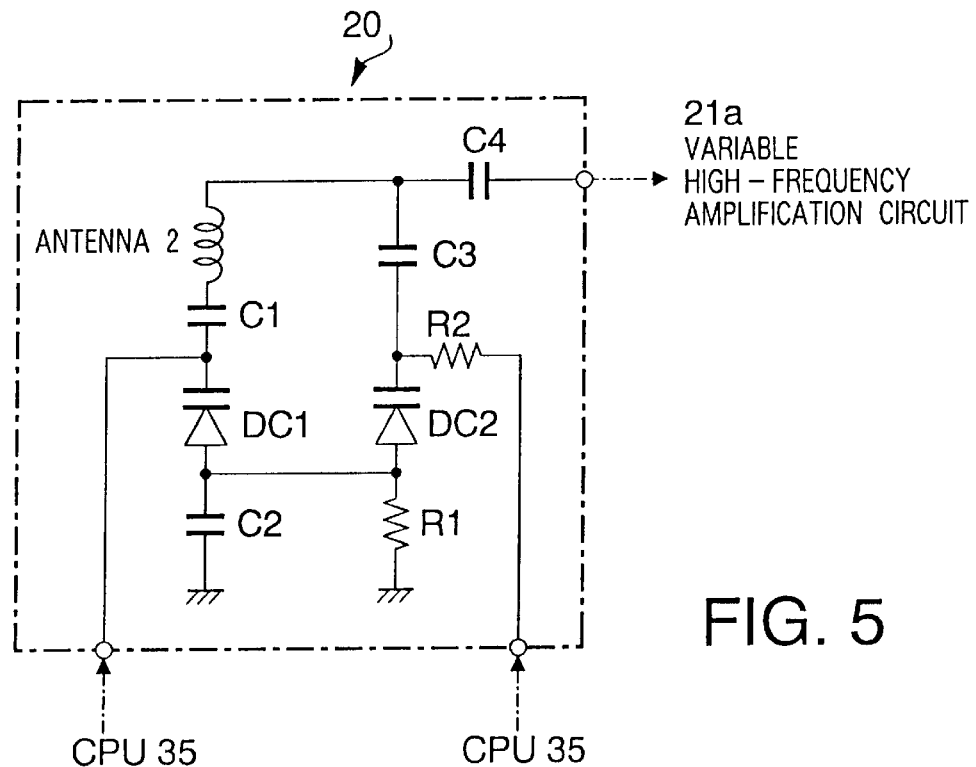
FIG. 5 is a circuit diagram showing a detailed configuration of an antenna varying circuit according to the fourth embodiment thereof.

FIG. 5 is a circuit diagram showing a detailed construction of antenna varying circuit 20 shown in FIG. 4. In FIG. 5, in the antenna varying circuit 20, capacitor C1, variable capacity diode DC1 and capacitor C2 which greatly vary the tuning frequency (in every frequency band) corresponding to the frequency changing control signal from CPU 35 are connected to antenna Ant2.

Furthermore, capacitor C3, variable capacity diode DC2 and resistor Ri which finely vary (in the receiving frequency steps) the tuning frequency corresponding to the frequency changing control signals coming CPU 35 are juxtaposed to antenna Ant2. A control signal coming from CPU 35 is supplied to the variable capacity diode DC2 through resistor R2, and they are connected to the input side of variable high-frequency amplification circuit 21a of the next stage through capacitor C4.

Figure 6:
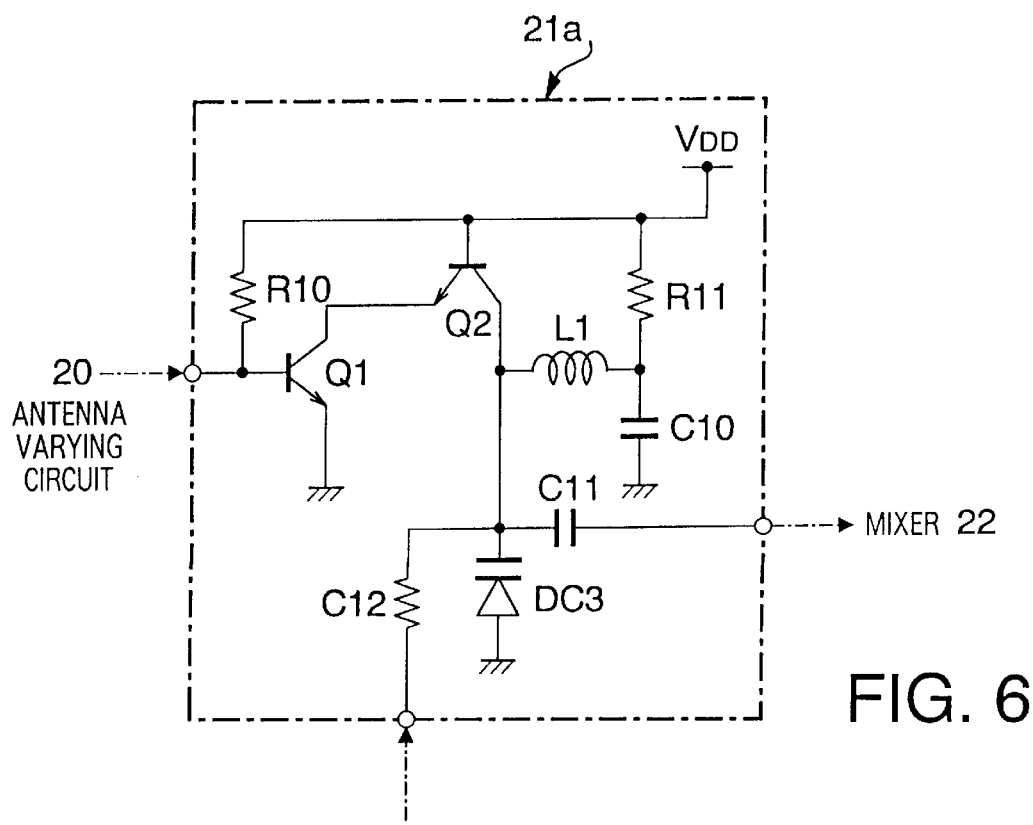
FIG. 6 is a circuit diagram showing a detailed configuration of a variable high-frequency amplification circuit according to the fourth embodiment thereof.

FIG. 6 is a circuit diagram showing a detailed configuration of variable high-frequency amplification circuit shown in FIG. 4. In FIG. 6, high-frequency (receiving) signals coming from antenna varying circuit 20 are inputted into the variable high-frequency amplification circuit 21, and the same circuit 21a is provided with transistors Q1, Q2 carrying out amplification of the high-frequency signals, resistors R10, R11 and capacitor C10. Furthermore, the variable high-frequency amplification circuit 20 is further provided with coil L1 which makes resonance with high-frequency (receiving) signals to be inputted, variable-capacity diode DC3, which is connected to the coil L1, for varying the tuning frequency corresponding to frequency-changing control signals coming from CPU 35, resistor R12 for applying the control signals to variable-capacity diode DC3, and capacitor 11 for cutting off direct current to send out amplification signals to the mixer 22 of the following stage.

Furthermore, although the variable high-frequency amplification circuit 21a is not provided with two changing means which greatly vary the tuning frequency (every frequency band) and finely vary (in receiving frequency steps) the tuning frequency, it may be acceptable that the same is provided with two changing means which greatly vary the tuning frequency and which finely vary the tuning frequency, as in the antenna varying circuit 20.

Figure 7:
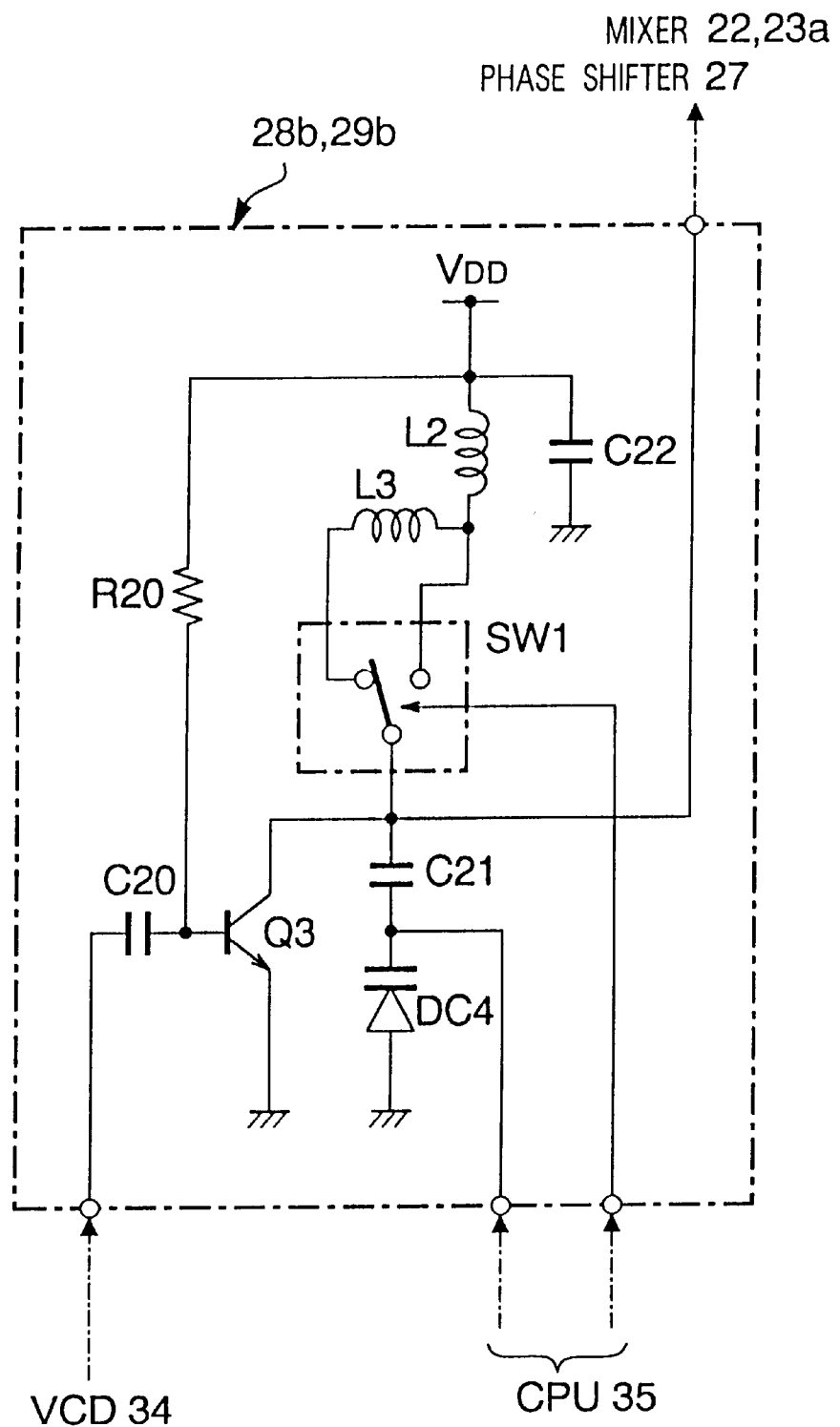
FIG. 7 is a circuit diagram showing a detailed configuration of a variable multiplication circuit according to the fourth embodiment thereof.
Figure 8:
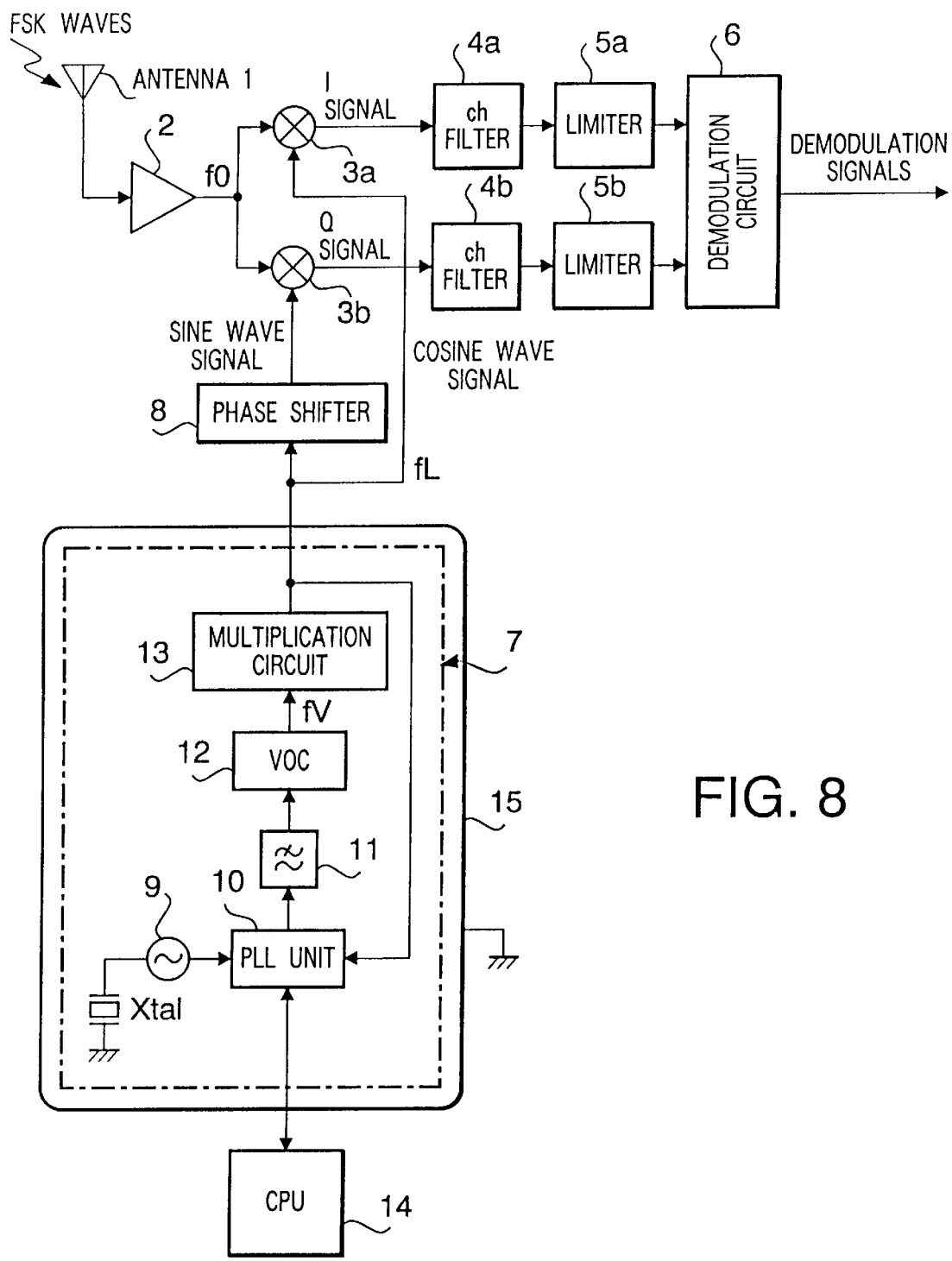
FIG. 8 is a block diagram showing a configuration of major parts of a conventional radio receiving apparatus.

FIG. 7 is a circuit diagram showing a detailed configuration of variable multiplication circuits 28b, 29b shown in FIG. 4, wherein the variable multiplication circuits 28b, 29b are provided with a transistor Q3, into which oscillation signals (fV) coming from VCO34 are inputted through capacitor C20, for outputting multiplied signals, coils L2, L3 for greatly varying the multiplication frequency (tuning frequency) corresponding to frequency changing control signals coming from CPU 35, and a switch SW1 which greatly varies the multiplication frequency (in every frequency band) by changing the coil L2 to its independent operation or changing the coils L2, L3 for an in-series connection. Furthermore, the circuits 28b, 29b are also provided with a capacitor C21 and a variable capacity diode DC4, which finely vary the multiplication frequency (in receiving frequency steps) corresponding to frequency changing control signals coming from CPU 35.

Next, a description is given of actions of the fourth preferred embodiment.

In the fourth preferred embodiment, the frequency is set to a frequency band which is granted for a district of receiving, and CPU 35 controls varying and setting of the receiving frequency (f0) on the basis of control programs stored in memory 36. All the other actions than this are the same as those of the first embodiment shown in FIG. 1, wherein the relationship between the frequency conversion in mixer 22 and orthogonal conversion in mixers 23a, 23b is the same as that shown in equation (1).

In a case of tuning to the frequency granted for a district of receiving, that is, in a case where the frequency is greatly varied, a control signal (voltage) is outputted from CPU 35 to a variable-capacity diode DC1 in the antenna varying circuit 25 shown in FIG. 5, and the switch SW1 which greatly varies the tuning frequency in the variable multiplication circuits 28b, 29b shown in FIG. 7 is changed.

Next, in a case of setting to the receiving frequency, that is, in a case where the receiving frequency is finely changed, a control signal coming from CPU 35 is applied to the variable capacity diode DC2 through a resistor R2 in the antenna varying circuit 20 shown in FIG. 5, whereby the frequency is tuned to the receiving frequency. Furthermore, in the variable high-frequency amplification circuit 21a shown in FIG. 6, a control signal coming from CPU 35 is applied to the variable-capacity diode DC3 through another resistor R12 to tune the frequency to the receiving frequency. Furthermore, in the variable multiplication circuits 28b, 29b shown in FIG. 7, a frequency changing control signal coming from CPU 35 is applied to the variable-capacity diode DC4 in order to cause the receiving frequency steps to be effected.

Furthermore, although the fourth preferred embodiment is described with the same applied to the first preferred embodiment shown in FIG. 1, the fourth embodiment may be applied to the second and third embodiment respectively shown in FIG. 2 and FIG. 3. The actions and effects thereof remain the same. In either case, it is necessary that the frequency relationship between the frequency conversion in mixer 22 and orthogonal conversion in mixers 23a, 23b meets the aforementioned equations.

Furthermore, antenna varying circuit 20, variable high-frequency amplification circuit 21a and variable multiplication circuits 28b, 29b are changed over by control of CPU 35. That is, although they are electrically changed, they may be mechanically changed. In this case, a semi-fixed capacitor may be used for variable-capacity diodes DC1 through DC4.

Thus, no mechanical filter is used in the fourth preferred embodiment, and a plurality of oscillation frequencies may be generated from a single local oscillation portion. Therefore, a single pager is able to receive electric waves of completely different frequency bands. At this time, it is possible to dynamically vary the receiving frequency bands by only setting the oscillation frequency (fv) of VCO34 to a value which can meet fv=f0/(x+y) wherein (f0) is the receiving frequency, (x) is a multiplication ratio of variable multiplication circuit 28b, and (y) is a multiplication ratio of variable multiplication circuit 29b.

As been made clear from the above description, according to the invention, since the resonance frequency of an antenna is different from the frequency of local oscillation signals inputted into a mixer, no unnecessary radiation of local oscillation signals which is the same as that of the resonance frequency of the antenna is produced, wherein it is possible to prevent noise from occurring due to receiving the unnecessary radiation waves again. Furthermore, no comparatively large-sized shield case, which covers the local oscillation portion and is difficult to be automatically mounted, is required any more. It is possible to make the apparatus small-sized and light in weight along with further improvement of the assembling efficiency.

Furthermore, according to the invention, since the receiving frequency band and the receiving and multiplication frequency bands corresponding to setting of the receiving frequency are changed over, and the receiving and multiplication frequencies corresponding to the receiving frequency are set, it is possible to easily set the receiving frequency in wide frequency bands where the service frequency band differs.

What is claimed is:

1. A radio receiving method for receiving a radio signal comprising:

receiving a radio signal by an antenna;

frequency converting the received signal output from the antenna with a first local oscillation signal having a first frequency differing from a resonance frequency of the antenna to generate an intermediate frequency signal, said first local oscillation signal being obtained by multiplying a standard frequency; and obtaining a baseband signal by frequency converting and orthogonal converting said intermediate frequency signal with a second local oscillation signal having a second frequency, said second local oscillation signal being obtained by multiplying said standard frequency.

2. The radio receiving method according to claim 1, wherein a frequency of said received signal, said first frequency and said second frequency satisfy the following relationship;

$$F0=F1+F2$$

wherein F0 is the frequency of said received signal, F1 is said first frequency and F2 is said second frequency.

3. The radio receiving method according to claim 1, further comprising:

generating a oscillation output signal on the basis of a oscillation signal output from a local oscillation section oscillating at a standard frequency, generating said first local oscillation signal by multiplying said oscillation output signal by a certain ratio R1; and generating said second local oscillation signal by multiplying said oscillation output signal by a certain ratio R2.

4. The radio receiving method according to claim 3, wherein an oscillation frequency of said oscillation output signal and the frequency of said received signal satisfy the following relationship;

$$FV=F0/(R1+R2)$$

wherein FV is the oscillation frequency of said oscillation output signal, F0 is the frequency of said received signal.

5. The radio receiving method according to claim 1, further comprising:

generating an oscillation output signal having a frequency differing from a resonance frequency of said antenna on the basis of an oscillation signal output from a local oscillation circuit oscillating at a standard frequency; and generating said second local oscillation signal by multiplying said oscillation output signal by a certain ratio R2; and wherein said oscillation output signal is used as said first local oscillation signal.

6. The radio receiving method according to claim 1, wherein, a receiving frequency of said antenna can be selectively switched, at least one of the frequency of said first local oscillation signal and the frequency of said second local oscillation signal is changed in accordance with the selected received frequency.

7. The radio receiving method according to claim 6, wherein switching of said received frequency is synchronized with the change of the frequencies of said first local oscillation signal and said second local oscillation signal.

8. A radio receiving apparatus that obtained a baseband signal by orthogonal converting a received signal output from an antenna that received a radio signal, said apparatus comprising:

a receiving system that receives a radio signal and outputs a received signal having a receiving frequency;

a local oscillating system that generates a first local oscillation signal having a first frequency, obtained by multiplying a standard frequency, differing from said receiving frequency and a second local oscillation signal having a second frequency obtained by multiplying said standard frequency;

a frequency converting system that mixes said received signal output from said receiving means and said first local oscillation signal to output an intermediate frequency signal; and an orthogonal converting device that orthogonal converts said intermediate frequency signal output from said frequency converting system with said second local oscillation signal to output a baseband signal.

9. The radio receiving apparatus according to claim 8, wherein a frequency of said received signal, said first frequency and said second frequency satisfy the following relationship:

$$F0=F1+F2$$

wherein F0 is the frequency of said received signal, F1 is said first frequency and F2 is said second frequency.

10. The radio receiving apparatus according to claim 8, said local oscillation system comprising:

an oscillation circuit that oscillates at a standard frequency;

an oscillation output signal generating circuit that generates an oscillation output signal having a frequency differing from a received frequency of said antenna on the basis of an oscillation signal output from said oscillation circuit;

a first multiplying circuit that generates said first local oscillation signal by multiplying said oscillation output signal output from said oscillation output signal generating circuit by a certain ratio R1; and a second multiplying circuit for generating said second local oscillation signal by multiplying said oscillation output signal output from said oscillation output signal generating circuit by a certain ratio R2.

11. The radio receiving apparatus according to claim 10, wherein an oscillation frequency of said oscillation output signal and a frequency of said received signal satisfy the following relationship:

$$FV=F0/(R1+R2)$$

wherein FV is the oscillation frequency of said oscillation output signal, and F0 is the frequency of said received signal.

12. The radio receiving apparatus according to claim 8, said local oscillation system further comprising:

an oscillation circuit that oscillates at a standard frequency;

an oscillation output signal generating circuit that generates an oscillation output signal having a frequency differing from a receiving frequency of said antenna on the basis of an oscillation signal output from said oscillation circuit; and a second multiplying circuit that generates said second local oscillation signal by multiplying said oscillation output signal output from said oscillation output signal generating circuit by a certain ratio R2;

wherein the oscillation output signal output from said oscillation output signal generating circuit is used as said first local oscillation signal.

13. The radio receiving apparatus according to claim 8, said ratio receiving apparatus further comprising:

an antenna control system that selectively switches a received frequency at said antenna; and an oscillation frequency control system that switches a frequency of said first local oscillation signal and a frequency of said second local oscillation signal to correspond to the switched received frequency.

14. The radio receiving apparatus according to claim 13, wherein switching of the receiving frequency of said antenna by said antenna control system is synchronized with switching of said first frequency and said second frequency by said oscillation frequency control system.

15. The radio receiving apparatus according to claim 13, said radio receiving apparatus further comprising:

a table in which a setting value corresponding to each of receiving frequencies changeable by said antenna control system corresponds to a setting value corresponding to each of received frequencies changeable by said oscillation frequency control system;

a control system that controls said antenna control system in accordance with the setting value contained in said table, while controlling said oscillation frequency control in accordance with the setting value corresponding to the setting value of said received frequency contained in said table.

16. The radio receiving apparatus according to claim 13, wherein said antenna control system comprises:

a receiving band control system that changes a frequency band of said receiving frequency; and a receiving frequency setting system that sets a receiving frequency in the changed frequency band at said receiving band control system.

17. The radio receiving apparatus according to claim 16, wherein said receiving band control system changes a received frequency band by switching an inductance or controlling a voltage to a voltage electrostatic capacity variable element, and sets a received frequency by controlling a voltage to a voltage electrostatic capacity variable element.

18. The radio receiving apparatus according to claim 13, said oscillation frequency control system comprising:

a multiplying frequency band control system that switches a multiplying frequency band corresponding to the change of the frequency band of said received frequency; and a multiplying frequency setting system that sets a multiplying frequency corresponding to received frequency in the switched multiplying frequency band.

19. The radio receiving apparatus according to claim 18, wherein said multiplying frequency band control system changes a multiplying frequency band by switching an inductance or controlling a voltage to a voltage electrostatic capacity variable element, and sets a multiplying frequency by controlling a voltage to a voltage electrostatic capacity variable element.

* * * * *